(12) United States Patent
Sun (10) Patent No.: US 9,153,521 B2
(45) Date of Patent: Oct. 6, 2015

(54) METHOD OF MANUFACTURING A PACKAGE CARRIER

(75) Inventor: Shih-Hao Sun, Hsinchu County (TW)

(73) Assignee: Subtron Technology Co., Ltd., Hsinchu County (TW)

( * ) Notice: Subject to any disclaimer, the term of this patent is extended or adjusted under 35 U.S.C. 154(b) by 1026 days.

(21) Appl. No.: 13/162,549

(22) Filed: Jun. 16, 2011

(65) Prior Publication Data

US 2012/0279962 A1 Nov. 8, 2012

(30) Foreign Application Priority Data

May 3, 2011 (TW) .............................. 100115471 A (51) Int. Cl.
*H01L 23/427* (2006.01)
*H01C 17/02* (2006.01)
(Continued)

(52) U.S. Cl.
CPC .............. *H01L 23/427* (2013.01); *H01C 17/02* (2013.01); *H01L 23/367* (2013.01); *H01L 23/13* (2013.01); *H01L 23/498* (2013.01); *H01L 33/486* (2013.01); *H01L 2224/48091* (2013.01); *H01L 2224/48137* (2013.01); *H01L 2933/0075* (2013.01);
(Continued)

(58) Field of Classification Search
CPC ..... H01L 23/367; H01L 23/427; H01L 23/13; H01L 23/498; H01L 33/468; H01L 2224/48091; H01L 2224/48137; H01L 2924/00014; H01L 2933/0075; H01L 21/4882; H01L 25/0657; H01L 23/12; H01L 23/14; H01L 23/28; H05B 2203/017; H05B 3/48; B23P 15/26; H01C 17/02; Y10T 29/49083; Y10T 29/49087; Y10T 29/49126

USPC .............. 29/611, 830, 832, 846, 854, 890.03, 29/592, 592.1, 527.2; 257/686–687, 698, 257/700, 706, 787; 438/109, 22, 125; 220/62.11
See application file for complete search history.

(56) References Cited

U.S. PATENT DOCUMENTS

| | | | |
|---|---|---|---|
| 6,599,768 B1 * | 7/2003 | Chen ............................... | 438/22 |
| 7,573,071 B2 | 8/2009 | Chang | |
| 7,948,076 B2 * | 5/2011 | Wang et al. .................... | 257/707 |
| 8,390,013 B2 * | 3/2013 | Tseng et al. .................... | 257/98 |

(Continued)

FOREIGN PATENT DOCUMENTS

| | | |
|---|---|---|
| JP | 2006196793 | 7/2006 |
| JP | 2008135532 | 6/2008 |

(Continued)

OTHER PUBLICATIONS

Machine Translation of JP 2010141279 A (filed as part of Applicant's IDS).*

(Continued)

*Primary Examiner* — Sarang Afzali
(74) *Attorney, Agent, or Firm* — Jianq Chyun IP Office (57) ABSTRACT

A method of manufacturing a package carrier is provided. An insulation cover is provided. The insulation cover has an inner surface and an outer surface opposite to each other, a plurality of openings, and a containing space. A patterned metal layer is formed on the outer surface of the insulation cover. A surface treatment layer is formed on the patterned metal layer. A heat dissipation element is formed in the containing space of the insulation cover and structurally connected to the insulation cover. A thermal-conductive layer is formed on a surface of the heat dissipation element, and a portion of the thermal-conductive layer is exposed by the openings of the insulation cover.

6 Claims, 6 Drawing Sheets

(51) Int. Cl.
*H01L 23/367* (2006.01)
*H01L 23/13* (2006.01)
*H01L 23/498* (2006.01)
*H01L 33/48* (2010.01)

(52) U.S. Cl.
CPC ...... *Y10T29/49083* (2015.01); *Y10T 29/49087* (2015.01); *Y10T 29/49126* (2015.01); *Y10T 29/49353* (2015.01)

(56) References Cited

U.S. PATENT DOCUMENTS

| | | | |
|---|---|---|---|
| 8,499,440 B2 * | 8/2013 | Japp et al. | 29/831 |
| 2008/0026498 A1 | 1/2008 | Tarsa et al. | |
| 2008/0191231 A1 | 8/2008 | Park et al. | |
| 2012/0061716 A1 * | 3/2012 | Yu et al. | 257/99 |

FOREIGN PATENT DOCUMENTS

| | | |
|---|---|---|
| JP | 2010141279 | 6/2010 |
| TW | 457836 | 10/2001 |
| TW | 200423347 | 11/2004 |
| TW | 200743228 | 11/2007 |
| WO | 2010115296 | 10/2010 |

OTHER PUBLICATIONS

Machien Translation of JP 2006196793 A (filed as part of Applicant's IDS).*
"Office Action of Taiwan counterpart application" issued on Sep. 23, 2013, p. 1-p. 7.
"Office Action of China Counterpart Application", issued on Apr. 30, 2014, p. 1-p. 6.

* cited by examiner

METHOD OF MANUFACTURING A PACKAGE CARRIER

CROSS-REFERENCE TO RELATED APPLICATION

This application claims the priority benefit of Taiwan application serial no. 100115471, filed on May 3, 2011. The entirety of the above-mentioned patent application is hereby incorporated by reference herein and made a part of this specification.

BACKGROUND OF THE INVENTION

1. Field of the Invention

The invention relates to a semiconductor structure and a method of manufacturing the same. More particularly, the invention relates to a package carrier and a method of manufacturing the same.

2. Description of the Related Art

A chip package provides a chip with proper signal and heat transmission paths and protects the chip structure. A leadframe often serves as a carrier of the chip when a conventional wire bonding technique is applied. As contact density in the chip gradually increases, the leadframe is no longer able to further improve the contact density and thus can be replaced by a package substrate which can achieve favorable contact density. Besides, the chip is packaged onto the package substrate by conductive media, such as metal conductive wires or bumps.

In the most common light emitting diode (LED) package structure, an LED chip need be packaged before the LED chip is used, and the LED chip generates a significant amount of heat when emitting light. Given that the heat cannot be dissipated and continues to accumulate in the LED package structure, the temperature of the LED package structure is increasingly raised. As such, the overly heated LED chip may have luminance decay, shortened life span, or even permanent damages. Therefore, heat sinks are usually configured in the existing LED package structure, so as to dissipate heat of the LED chip.

The conventional package substrate is comprised of a plurality of patterned conductive layers and at least one insulation layer. The insulation layer is configured between two adjacent patterned conductive layers for electrical insulation. A heat sink is fixed onto a bottom surface of the package substrate through an adhesive layer. In most cases, the LED chip is electrically connected to the package substrate, and heat generated by the LED chip can be conducted from the patterned conductive layers and the insulation layer to the heat sink. Since the thermal conductivity of the adhesive layer and the insulation layer is unfavorable, thermal resistance increases when the heat generated by the LED chip is conducted to the heat sink through the insulation layer and the adhesive layer, which leads to unsatisfactory heat dissipation. Hence, how to dissipate the heat generated by the LED chip to the external surroundings in an efficient manner has become a focus to researchers and designers in this field.

SUMMARY OF THE INVENTION

The invention is directed to a package carrier for carrying a heat-generating element.

The invention is further directed to a method of manufacturing a package carrier. By applying the method, the aforesaid package carrier can be formed.

In an embodiment of the invention, a method of manufacturing a package carrier includes following steps. An insulation cover is provided. The insulation cover has an inner surface and an outer surface opposite to each other, a plurality of openings, and a containing space. A patterned metal layer is formed on the outer surface of the insulation cover. A surface treatment layer is formed on the patterned metal layer. A heat dissipation element is foamed in the containing space of the insulation cover. The heat dissipation element is structurally connected to the insulation cover. A thermal-conductive layer is formed on a surface of the heat dissipation element, and the openings of the insulation cover expose a portion of the thermal-conductive layer.

According to an embodiment of the invention, the step of forming the openings of the insulation cover includes irradiating the outer surface of the insulation cover with a laser beam to form the openings that penetrate the outer surface and the inner surface of the insulation cover.

According to an embodiment of the invention, the insulation cover includes a plurality of catalyst particles, and a method of forming the patterned metal layer includes activating parts of the catalyst particles to faun the patterned metal layer.

According to an embodiment of the invention, a method of forming the patterned metal layer includes electroplating.

According to an embodiment of the invention, a method of forming the insulation cover includes injection molding.

According to an embodiment of the invention, the heat dissipation element includes a heat sink or a heat pipe.

According to an embodiment of the invention, a material of the thermal-conductive layer includes copper, gold, or silver.

In an embodiment of the invention, a package carrier for carrying at least one heat-generating element is provided. The package carrier includes an insulation cover, a patterned metal layer, a surface treatment layer, a heat dissipation element, and a thermal-conductive layer. The insulation cover has an inner surface and an outer surface opposite to each other, a plurality of openings, and a containing space. The patterned metal layer is disposed on the outer surface of the insulation cover. The surface treatment layer is disposed on the patterned metal layer. The heat dissipation element is disposed in the containing space of the insulation cover and structurally connected to the insulation cover. The thermal-conductive layer is disposed on a surface of the heat dissipation element, and a portion of the thermal-conductive layer is located between the heat dissipation element and the insulation cover. The openings of the insulation cover expose a portion of the thermal-conductive layer, and the at least one heat-generating element is disposed on the portion of the thermal-conductive layer exposed by a corresponding one of the openings.

According to an embodiment of the invention, the heat dissipation element includes a heat sink or a heat pipe.

According to an embodiment of the invention, a material of the thermal-conductive layer includes copper, gold, or silver.

According to an embodiment of the invention, the insulation cover includes a plurality of catalyst particles.

According to an embodiment of the invention, the package carrier further includes an activation layer. The activation layer is formed by activating the catalyst particles and is located between the heat dissipation element and the portion of the conductive layer exposed by the openings.

Based on the above, in the package carrier described in the embodiments of the invention, the heat dissipation element is disposed in the containing space of the insulation cover, and the openings of the insulation cover expose a portion of the thermal-conductive layer. Hence, when the heat-generating element is disposed on the package carrier, the heat generated by the heat-generating element can be rapidly transmitted to the external surroundings via the thermal-conductive layer and the heat dissipation element directly. As such, the package carrier described in the embodiments of the invention can effectively dissipate the heat generated by the heat-generating element, and the efficiency and the life span of the heat-generating element can both be increased. Moreover, the heat-generating element can be configured at the peripheries of the package carrier according to the embodiments of the invention, and thereby light emitting effects that can be achieved by a three-dimensional polyhedron can be accomplished herein.

Other features and advantages of the invention will be further understood from the further technological features disclosed by the embodiments of the invention wherein there are shown and described embodiments of this invention, simply by way of illustration of modes best suited to carry out the invention.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF EMBODIMENTS

Figure 1A:
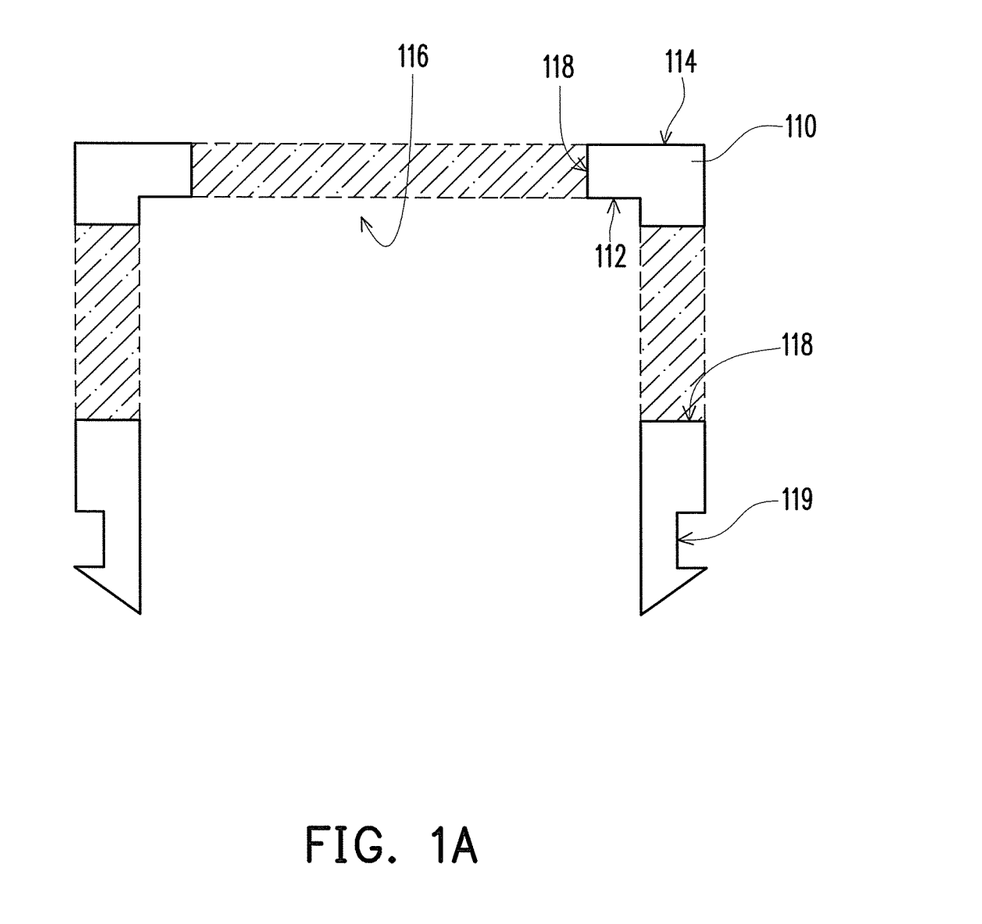
FIG. 1A to FIG. 1D are schematic cross-sectional views illustrating a method of manufacturing a package carrier according to an embodiment of the invention.

FIG. 1A to FIG. 1D are schematic cross-sectional views illustrating a method of manufacturing a package carrier according to an embodiment of the invention. With reference to FIG. 1A, in the method of manufacturing a package carrier according to this embodiment, an insulation cover 110 is provided. The insulation cover 110 has an inner surface 112 and an outer surface 114 opposite to each other, a containing space 116, and a plurality of openings 118. The insulation cover 110 is shaped as the letter "n" or "⊓", for instance, and the insulation cover 110 further has a plurality of lock portions 119. Note that it is not necessary for the insulation cover 110 to be equipped with the lock portions 119 in other embodiments of the invention. Besides, the insulation cover 110 is made by injection molding, for instance.

Figure 1B:
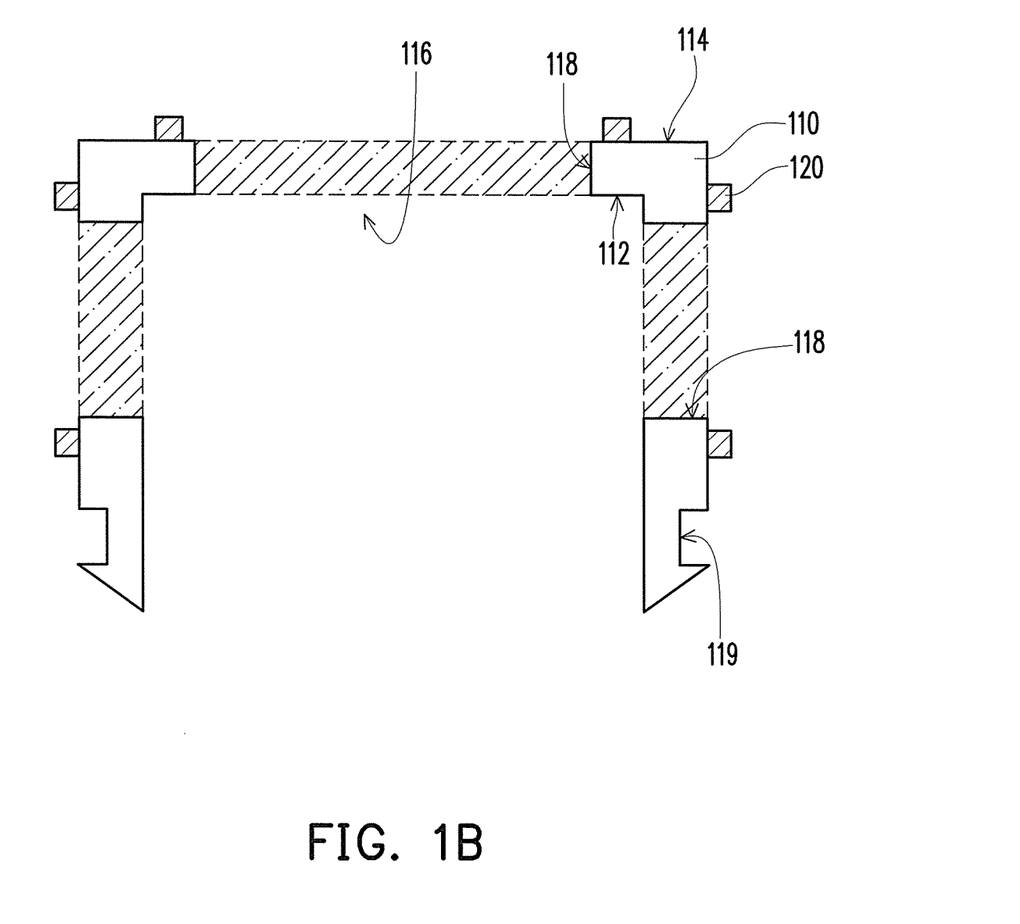

With reference to FIG. 1B, a patterned metal layer 120 is formed on a portion of the outer surface 114 of the insulation cover 110. Here, the patterned metal layer 120 is made by electroplating, e.g., chemical plating or sputtering. In other embodiments that are not shown in the drawings, given that the insulation cover includes a plurality of catalyst particles, the outer surface of the insulation cover can be irradiated by a laser beam, so as to activate parts of the catalyst particles and form the patterned metal layer.

Figure 1C:
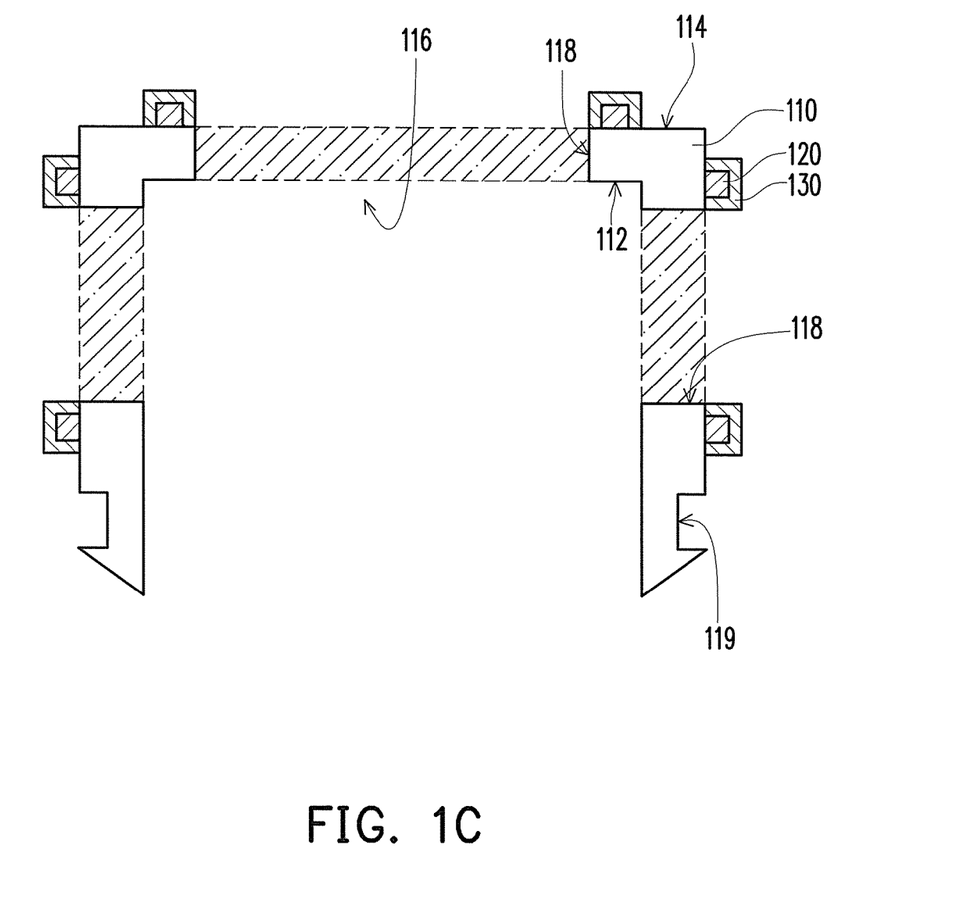

With reference to FIG. 1C, a surface treatment layer 130 is formed on the patterned metal layer 120. The surface treatment layer 130 completely covers the patterned metal layer 120, and a method of forming the surface treatment layer 130 includes electroplating. Here, the surface treatment layer 130 is constituted by a nickel layer, a gold layer, or a nickel-gold composite layer, for instance.

Figure 1D:
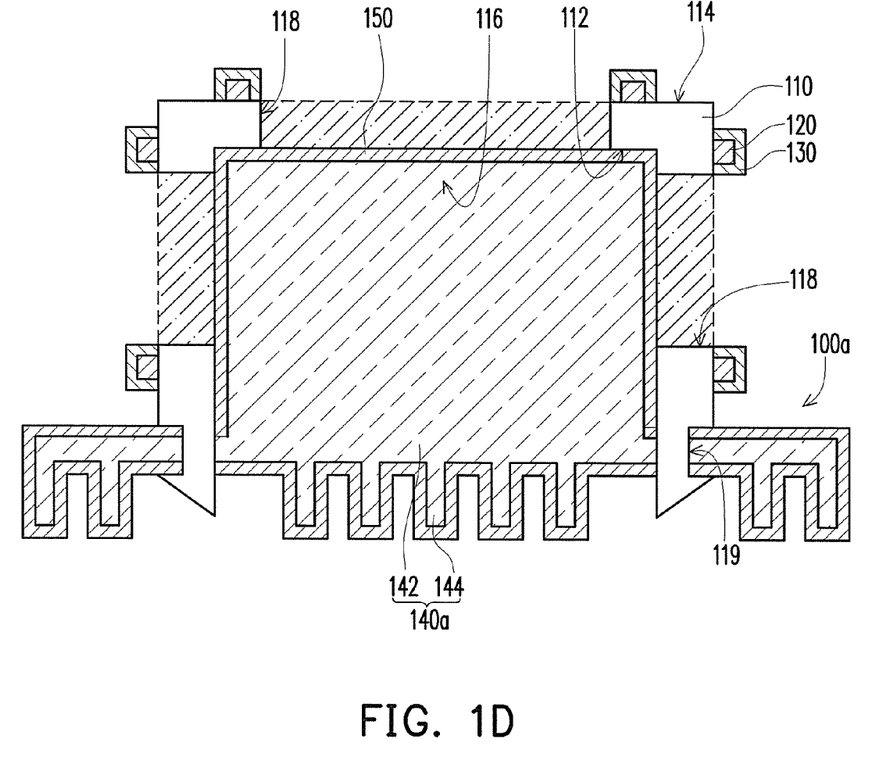

With reference to FIG. 1D, a heat dissipation element 140a is formed in the containing space 116 of the insulation cover 110 and structurally connected to the insulation cover 110. Here, the heat dissipation element 140a is fixed to the insulation cover 110 via the lock portions 119 that are locked to the insulation cover 110, for instance. Certainly, in other embodiments that are not shown in the drawings, the heat dissipation element 140a and the insulation cover 110 can be connected together by screws, adhesive, low-temperature melting, or electroplating, which should not be construed as a limitation to the invention. So far, the fabrication of the package carrier 100 is substantially completed.

Figure 1E:
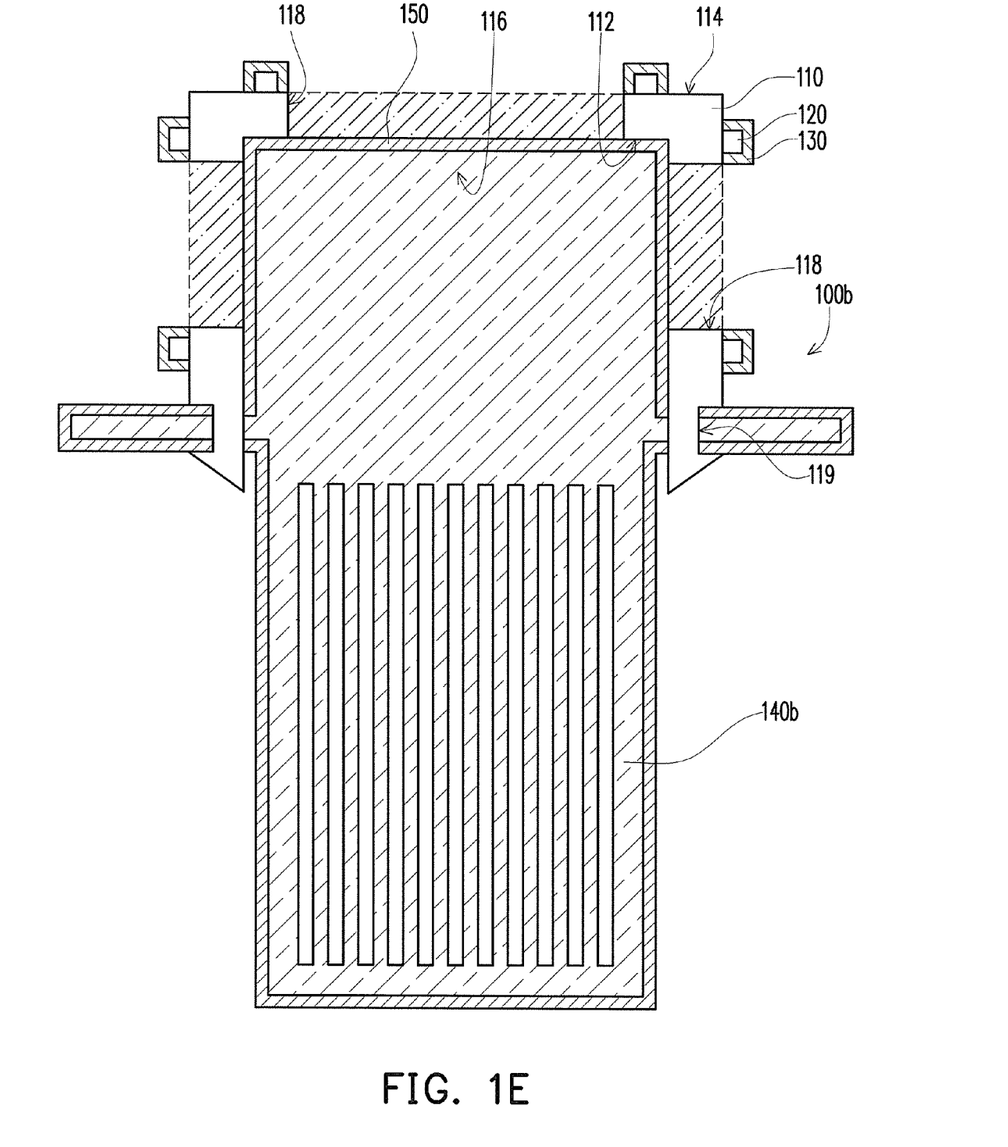
FIG. 1E is a schematic cross-sectional view illustrating a package carrier according to an embodiment of the invention.

To be more specific, a thermal-conductive layer 150 is already formed on a surface of the heat dissipation element 140a according to this embodiment, and the openings 118 of the insulation cover 110 expose a portion of the thermal-conductive layer 150. The heat dissipation element 140a includes a protrusion 142 and a plurality of fins 144 connected to the protrusion 142, and the protrusion 142 is disposed in the containing space 116. Although the heat dissipation element 140a herein is constituted by the protrusion 142 and the fins 144, it should be mentioned that the type of the heat dissipation element 140a is not limited in this embodiment. According to other embodiments that are not shown in the drawings, the heat dissipation element can be a heat sink which does not have the fins. Alternatively, as indicated in FIG. 1E, the heat dissipation element 140b of the package carrier 100b can also be a heat pipe. That is to say, the type of the heat dissipation element 140a in this embodiment is exemplary and is not limited in the invention.

As indicated in FIG. 1D, the package carrier 100 of this embodiment structurally includes the insulation cover 110, the patterned metal layer 120, the surface treatment layer 130, the heat dissipation element 140a, and the thermal-conductive layer 150. The insulation cover 110 has the inner surface 112 and the outer surface 114 opposite to each other, the containing space 116, the openings 118, and the lock portions 119. The patterned metal layer 120 is disposed on the outer surface 114 of the insulation cover 110. The surface treatment layer 130 is disposed on the patterned metal layer 120. The heat dissipation element 150 is disposed in the containing space 116 of the insulation cover 110 and structurally connected to the insulation cover 110. The thermal-conductive layer 150 is disposed on the surface of the heat dissipation element 140a, and a portion of the thermal-conductive layer 150 is located between the heat dissipation element 140a and the insulation cover 110. The openings 118 of the insulation cover 110 expose a portion of the thermal-conductive layer 150.

Figure 2:
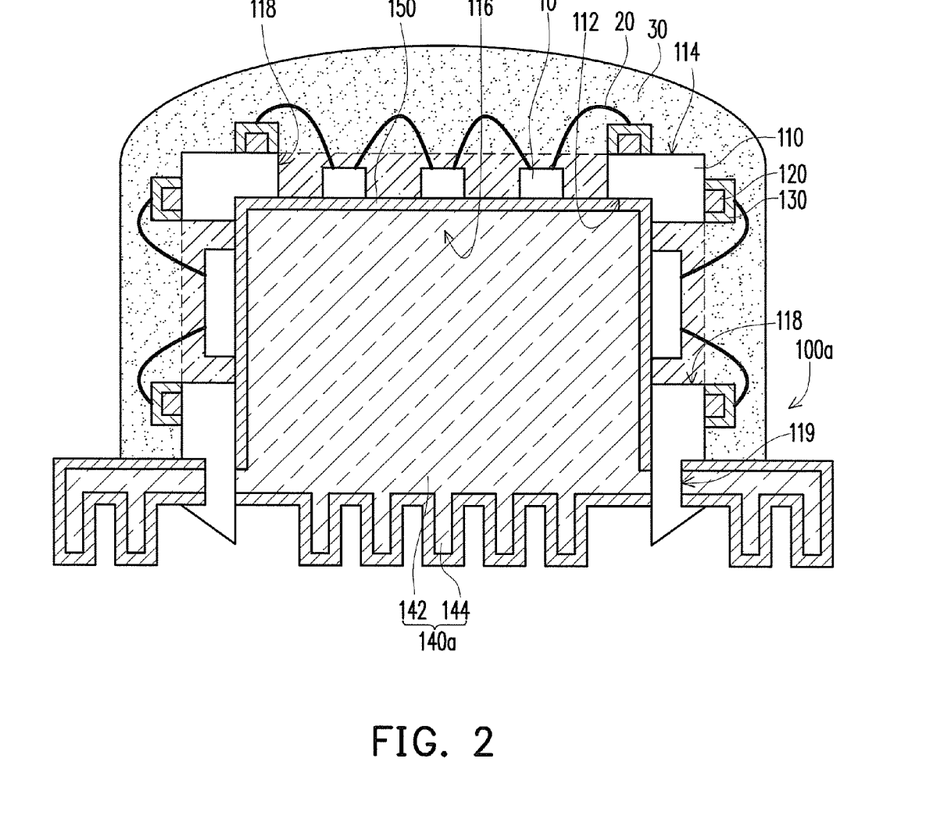
FIG. 2 is a schematic cross-sectional view illustrating that the package carrier depicted in FIG. 1D holds heat-generating elements.

FIG. 2 is a schematic cross-sectional view illustrating that the package carrier depicted in FIG. 1D holds heat-generating elements. With reference to FIG. 2, the package carrier 100 of this embodiment is suitable for carrying at least one heat-generating element 10. In FIG. 2, five heat-generating elements 10 are schematically shown. The heat-generating elements 10 are disposed on a portion of the thermal-conductive layer 150 exposed by the corresponding openings 118. Besides, the heat-generating elements 10 are, for instance, electronic chips or photo-electric elements, which should not be construed as a limitation to the invention. For instance, the electronic chips can be integrated circuit (IC) chips, e.g., chip modules or chips that include graphic chips, memory chips, and so on. The photo-electric elements are LEDs, laser diodes, or gas discharge light sources, for instance. In this embodiment, the heat-generating elements 10 are LEDs, for instance.

Specifically, the heat-generating elements 10, e.g., LEDs, can be electrically connected to the surface treatment layer 130 on the patterned metal layer 120 via a plurality of bonding wires 20 in a wire-bonding manner. The heat-generating elements 10, the bonding wires 20, and a portion of the package carrier 100 can also be encapsulated by a molding compound 30, so as to secure the electrical connection among the heat-generating elements 10, the bonding wires 20, and the package carrier 100. The heat-generating elements 10 of this embodiment are disposed on the portion of the thermal-conductive layer 150 exposed by the openings 118, and thus the heat-generating elements 10 can be configured at the peripheries of the package carrier 100. Thereby, light emitting effects that can be achieved by a three-dimensional polyhedron can be accomplished herein, i.e., the package carrier can achieve front and side light emission.

Moreover, the heat dissipation element 140a is disposed in the containing space 116 of the insulation cover 110, and the openings 118 of the insulation cover 110 expose a portion of the thermal-conductive layer 150. Hence, when the heat-generating elements 10 are disposed on a portion of the thermal-conductive layer 150 of the package carrier 100, the heat generated by the heat-generating elements 10 can be rapidly transmitted to the external surroundings through the thermal-conductive layer 150 and the heat dissipation element 140a directly. As such, the package carrier 100 described in this embodiment can effectively dissipate the heat generated by the heat-generating elements 10, and the efficiency and the life span of the heat-generating elements 10 can both be improved.

Besides, the insulation cover 110 is disposed on the heat dissipation element 140a. Therefore, when the heat-generating elements 10 (e.g., the LEDs) are electrically connected to the surface treatment layer 130 on the patterned metal layer 120 via the bonding wires 20, the insulation cover 110 can electrically insulate the surface treatment layer 130 on the patterned metal layer 120 from the thermal-conductive layer 150 below the insulation cover 110, so as to prevent short circuit.

To sum up, in the package carrier described in the embodiments of the invention, the heat dissipation element is disposed in the containing space of the insulation cover, and the openings of the insulation cover expose a portion of the thermal-conductive layer. Hence, when the heat-generating element is disposed on the package carrier, the heat generated by the heat-generating element can be rapidly transmitted to the external surroundings via the thermal-conductive layer and the heat dissipation element directly. As such, the package carrier described in the embodiments of the invention can effectively dissipate the heat generated by the heat-generating element, and the efficiency and the life span of the heat-generating element can both be increased. Moreover, the heat-generating element can be configured at the peripheries of the package carrier according to the embodiments of the invention, and thereby light emitting effects that can be achieved by a three-dimensional polyhedron can be accomplished herein. That is to say, the package carrier can achieve front and side light emission and thus can be applied to a greater extent.

It will be apparent to those skilled in the art that various modifications and variations can be made to the structure of the disclosed embodiments without departing from the scope or spirit of the disclosure. In view of the foregoing, it is intended that the disclosure covers modifications and variations of this disclosure provided they fall within the scope of the following claims and their equivalents.

What is claimed is:

1. A method of manufacturing a package carrier, comprising:
   providing an insulation cover, the insulation cover having an inner surface and an outer surface opposite to each other, a plurality of openings, and a containing space, wherein the insulation cover comprises a plurality of catalyst particles;
   irradiating the outer surface of the insulation cover with a laser beam to activate parts of the catalyst particles so as to form a patterned metal layer on the outer surface of the insulation cover;
   forming a surface treatment layer on the patterned metal layer; and
   forming a heat dissipation element in the containing space of the insulation cover, the heat dissipation element being structurally connected to the insulation cover, wherein a thermal-conductive layer is formed on a surface of the heat dissipation element, and the openings of the insulation cover expose a portion of the thermal-conductive layer.

2. The method of manufacturing the package carrier as recited in claim 1, the step of forming the openings of the insulation cover comprising:
   irradiating the outer surface of the insulation cover with a laser beam to form the openings penetrating the outer surface and the inner surface of the insulation cover.

3. The method of manufacturing the package carrier as recited in claim 1, wherein a method of forming the patterned metal layer comprises electroplating.

4. The method of manufacturing the package carrier as recited in claim 1, wherein a method of forming the insulation cover comprises injection molding.

5. The method of manufacturing the package carrier as recited in claim 1, wherein the heat dissipation element comprises a heat sink or a heat pipe.

6. The method of manufacturing the package carrier as recited in claim 1, wherein a material of the thermal-conductive layer comprises copper, gold, or silver.

* * * * *